United States Patent
Kobayashi

(10) Patent No.: US 6,785,172 B2
(45) Date of Patent: Aug. 31, 2004

(54) SEMICONDUCTOR MEMORY DEVICE

(75) Inventor: Yoshiki Kobayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 57 days.

(21) Appl. No.: 10/325,931

(22) Filed: Dec. 23, 2002

(65) Prior Publication Data

US 2004/0001377 A1 Jan. 1, 2004

(30) Foreign Application Priority Data

Jun. 27, 2002 (JP) ........................................ 2002-188078

(51) Int. Cl.[7] ................................................. G11C 7/00
(52) U.S. Cl. ......................... 365/201; 365/220; 365/221
(58) Field of Search ................................. 365/201, 220, 365/221, 189.12, 189.07, 240

(56) References Cited

U.S. PATENT DOCUMENTS 6,570,800 B2 * 5/2003 Tanaka et al. .............. 365/219
2002/0149013 A1 * 10/2002 Sato et al. .................... 257/48

FOREIGN PATENT DOCUMENTS

| JP | 62031100 | 2/1987 |
| JP | 10021109 | 1/1998 |
| JP | 10078475 | 3/1998 |

* cited by examiner

Primary Examiner—Richard Elms
Assistant Examiner—Hien Nguyen
(74) Attorney, Agent, or Firm—Volentine Francos, PLLC

(57) ABSTRACT

In a semiconductor memory device according to the present invention, which allows a memory cell array unit and a memory circuit internal logic unit to be tested independently of each other, a first test circuit unit TCi1 to which an address signal a", a scan-in signal SIN, a scan select signal SS and a shift clock signal SCLK are input, outputs an address signal a'" and a scan-out signal SiOUT1. The address signal a'" is input to the memory cell array unit MCA and a column selector CS, whereas the scan-out signal SiOUT1 is input to a second test circuit unit TCi2. The second test circuit unit TCi2, to which the scan-out signal SiOUT1, the scan select signal SS, a write control signal WCTRL and a scan clock signal SCLK are input, outputs at a scan-out signal SOUT. The first test circuit unit and the second test circuit unit each achieve a parallel/serial conversion function.

20 Claims, 14 Drawing Sheets

LATL30~LATL33: DATA THROUGH WHEN CLK=L
DATA LATCH WHEN CLK=H

LATH30~LATH33: DATA THROUGH WHEN CLK=H
DATA LATCH WHEN CLK=L

LATL30~LATL33: DATA THROUGH WHEN CLK=L
DATA LATCH WHEN CLK=H

LATH30~LATH33: DATA THROUGH WHEN CLK=H
DATA LATCH WHEN CLK=L

SEMICONDUCTOR MEMORY DEVICE

BACKGROUND OF THE INVENTION

1. Field of the Invention

The present intention relates to a semiconductor memory device having a test circuit.

2. Description of the Related Art

Test circuits internally provided in LSIs include those disclosed Japanese Unexamined Patent Publication No. 1987-31100 (Reference 1), Japanese Unexamined Patent Publication No. 1998-21109 (reference 2) and Japanese Unexamined Patent Publication No. 1998-78475 (Reference 3).

The test circuit disclosed in Reference 1 allows either a "read data through mode" or a "shift-functioning latch mode" to be selected. When the LSI is engaged in normal operation, the test circuit is set in the read data through mode. In this mode, the test circuit allows the data read out from a memory circuit (a semiconductor memory device) to pass through to be output to the outside of the LSI. When testing the LSI, the test circuit is set in the shift-functioning latch mode. At this setting, the test circuit temporarily stores therein the data read out from the memory circuit and then serially outputs the stored data. A decision can be made as to whether or not the data read out from the memory circuit match an expected value by observing the serial data.

The test circuit disclosed in Reference 2 allows an address signal that has been input therein to pass through to be provided to the memory circuit while the LSI is engaged in normal operation. During a test operation of the LSI, however, the test circuit converts a serial signal that has been input to a parallel signal and provides the parallel signal to the memory circuit as an address signal. This structure enables the test circuit to provide any address signal to the memory circuit.

By utilizing the test circuit disclosed in Reference 3, it becomes possible to provide any address signal and/or data to the memory circuit. In addition, the data read out from the memory circuit can be converted to a serial signal and then be output to the outside.

A semiconductor memory device normally comprises two separate components, i.e., a memory cell array unit having a plurality of memory cells are arranged in an array and a memory circuit internal logic unit. The memory circuit internal logic unit includes an address decoder, a column selector and like. By using a test circuit in the related art, an arbitrary address signal can be set at the memory circuit, data output from the memory circuit can be verified and arbitrary data can be written into the memory circuit. However, the test circuit in the related art tests the overall memory circuit, and the logic unit within the memory circuit is not specifically tested in the scan test. This gives rise to a problem in that even when normal results are obtained through a test conducted on a semiconductor memory device, it is difficult to pinpoint the exact location where the problem has occurred and thus, it is difficult to clarify the problem or to reassess the circuit at the design level.

SUMMARY OF THE INVENTION

An object of the present invention, which has been completed by addressing the problem of the related art discussed above, is to provide a new and improved semiconductor memory device whose memory cell array unit and memory circuit internal logic unit can be tested independently of each other.

In order to achieve the object described above, in a first aspect of the present invention, a semiconductor memory device comprising a memory cell array unit that is constituted of a plurality of memory cells in which data are stored, an address signal generating unit that generates an address signal with an n-bit width to specify a single memory cell or a plurality of memory cells among the plurality of memory cells and an address signal test circuit unit that converts the address signal with the n-bit width output from the address signal generating unit to a serial signal for address signal observation and outputs the serial signal resulting from the conversion is provided. By observing the serial signal for address signal observation, a decision can be made as to whether or not the address signal output from the address signal generating unit is normal.

In addition, the address signal test circuit unit may achieve a function of converting a test address several signal provided from the outside to a test address signal with the n-bit width and a function of taking in the address signal from the address signal generating unit and then providing either the test address signal or the address signal to the memory cell array unit so that an arbitrary address signal can be provided to the memory cell array unit by bypassing the address signal generating unit.

In a second aspect of the present invention, a semiconductor memory device comprising a memory cell array unit constituted of a plurality of memory cells in which data are stored, a data input/output unit achieving a function of outputting data with an m-bit width to be written into the memory cell array unit and a function of reading out data with the m-bit width from the memory cell array unit and a data test circuit unit that converts the data with the m-bit width read out from the memory cell array unit to a serial signal for data observation and outputs the serial signal resulting from the conversion, is provided. A decision can be made as to whether or not the data read out from the memory cell array unit match an expected value by observing the serial signal for data observation.

In addition, the data test circuit unit may achieve a function of converting a test data serial signal provided from the outside to a test data signal with the m-bit width and a function of providing the test data signal either to the memory cell array unit or the data input/output unit so that arbitrary data can be provided individually to the memory cell array unit or the data input/output unit.

If the semiconductor memory device adopts a structure in which a test address serial signal is provided to the data test circuit unit as a test data serial signal by an address signal test circuit unit, it is no longer necessary to obtain the test data serial signal from the outside. Likewise, if the semiconductor memory device adopts a structure in which the test data serial signal is provided to the address signal test circuit unit as a test address serial signal by the data test circuit unit, it is no longer necessary to obtain the test address serial signal from the outside.

The address signal test circuit unit may be constituted of a shift register. It is desirable that such a shift register be constituted of n flip-flops each corresponding to one of the bits in the test address signal and the address signal.

The data test circuit unit, too, may be constituted of a shift register. It is desirable that such a shift register be constituted of m flip-flops each corresponding to one of the bits in the data read out from the memory cell array unit and the test data signal. Alternatively, the shift register may be constituted of m sets of latch groups. Each latch group should include a first latch that latches input data in response to a signal indicating a logical high level and a second latch that latches the input data in response to a signal indicating a logical low level. The first latch or the second latch may be utilized as an output data latch function unit during a normal operation of the semiconductor memory device as well.

As described above, the present invention enables an operation function test to be conducted individually on the memory cell array unit, the address signal generating unit and the data input/output unit, independently of one another. As a result, it becomes possible to specify the exact location where the problem has occurred when abnormal results have been obtained in a test conducted on the semiconductor memory device. Furthermore, a problem latent in the semiconductor memory device manufacturing process can be clarified and the circuit can be reassessed at the design level with greater ease.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
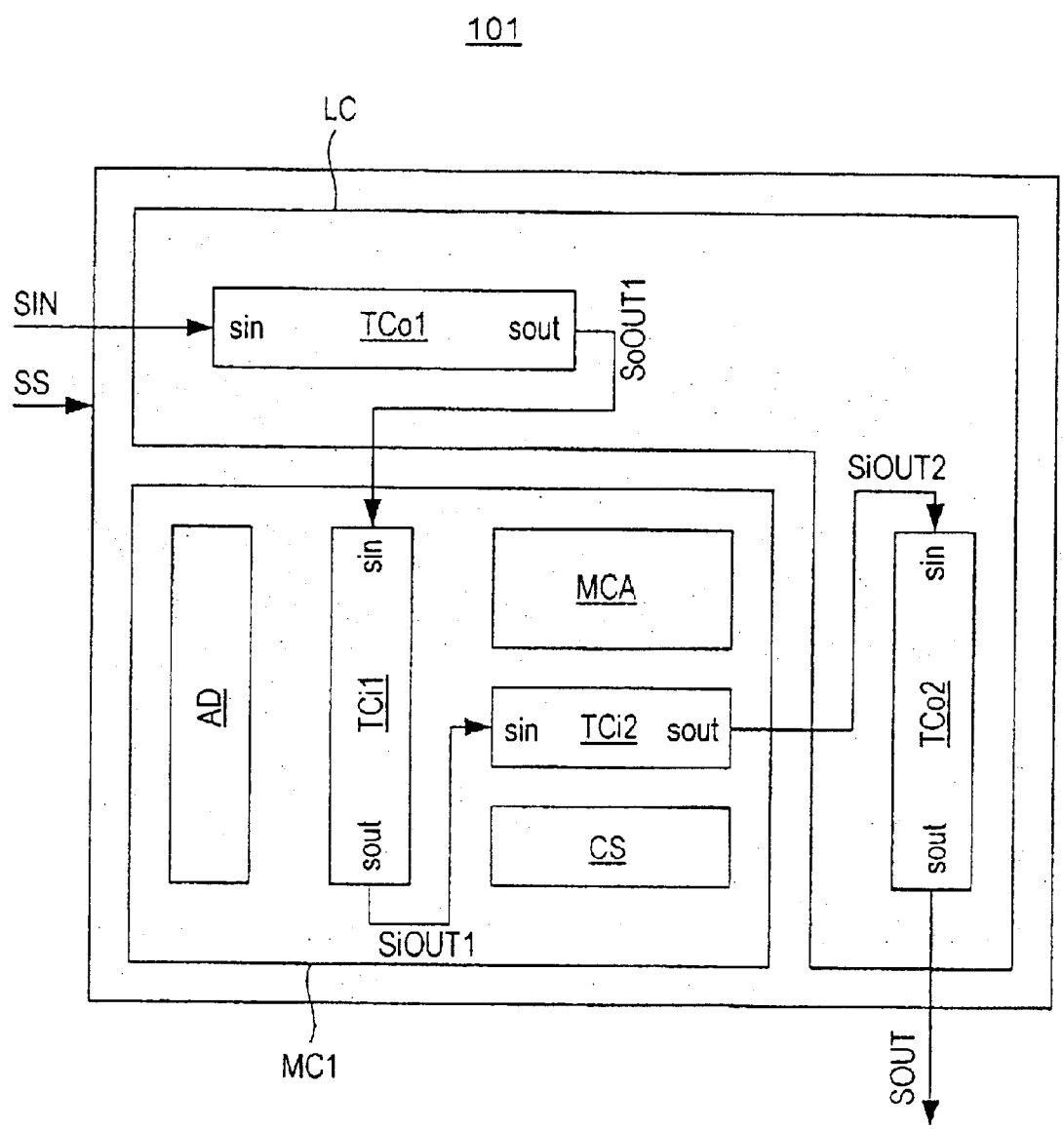
FIG. 1 is a block diagram showing the structure of the LSI which includes the memory circuit unit achieved in an embodiment of the present invention.

The following is a detailed explanation of the preferred embodiments of the semiconductor memory device according to the present invention, given in reference to the attached drawings. It is to be noted that the same reference numerals are assigned to components achieving substantially identical functions and structural features in the following explanation and the attached drawings to preclude the necessity for a repeated explanation thereof.

(First Embodiment)

The structures and the operations of a first test circuit unit TCi1 (an address signal test circuit unit) and a second test circuit unit TCi2 (a data test circuit unit) provided in a memory circuit unit MC1 achieved in the first embodiment of the present invention are explained in reference to FIGS. 1~8.

A consolidated memory-type system LSI 101 shown in FIG. 1 includes the memory circuit unit MC1 and a peripheral logic circuit unit LC. The memory circuit unit MC1 comprises test circuits, i.e., the first test circuit unit TCi1 and the second test circuit unit TCi2, a memory circuit unit internal logic circuit, i.e., an address decoder (an address signal generating unit) AD and a column selector (a data input/output unit) CS and a memory cell array unit MCA constituted of a plurality of memory cells. The peripheral logic circuit LC includes a first external test circuit unit TCo1 and a second external test circuit unit TCo2.

A scan-in signal SIN provided from the outside of the LSI 101 is input to the first external test circuit unit TCo1. A scan-out signal SoOUT1 output by the first external test circuit unit is input to the first test circuit unit TCi1. A scan-out signal SiOUT1 output by the first test circuit unit TCi1 is input to the second test circuit unit TCi2. A scan-out signal SiOUT2 output by the second test circuit unit TCi2 is input to the second external test circuit unit TCo2. Then, the second external test circuit unit TCo2 outputs a scan-out signal SOUT to the outside of the LSI 101. Thus, a so-called scan path is formed by the first external test circuit unit TCo1, the second external test circuit unit TCo2, the first test circuit unit TCi1 and the second test circuit unit TCi2.

Since the first external test circuit unit TCo1 and the second external test circuit unit TCo2 are provided in the peripheral logic circuit unit LC, the operation of the peripheral logic circuit LC can be tested in the LSI 101. In addition, since the first test circuit unit TCi1 and the second test circuit unit TCi2 are provided within the memory circuit unit MC1, the operations of the memory cell array unit MCA, the address decoder AD and the column selector CS can be individually tested in the LSI 101.

Figure 2:
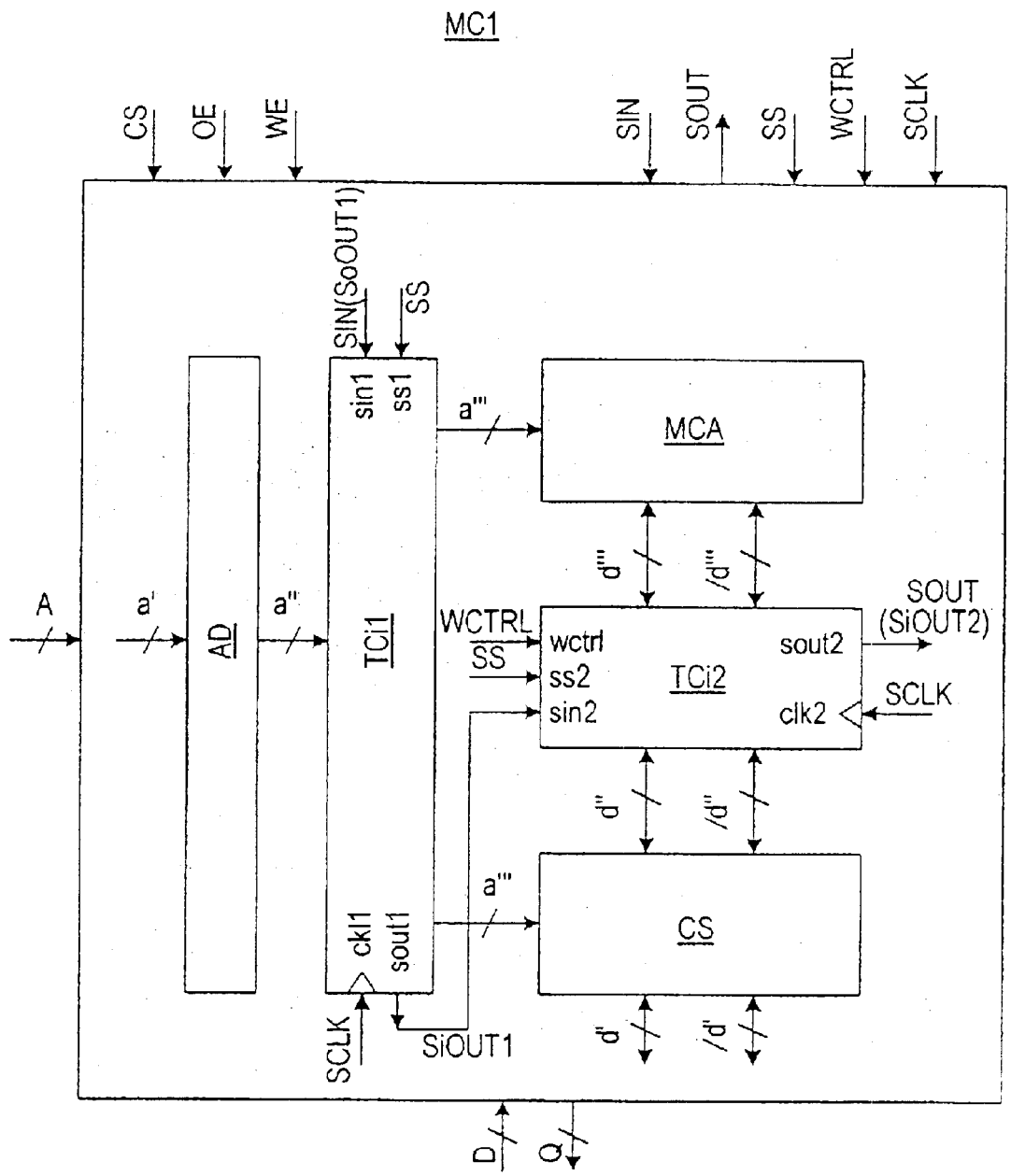
FIG. 2 is a block diagram showing the structure of the memory circuit unit achieved in a first embodiment of the present invention.

As shown in FIG. 2, the asynchronous memory circuit unit MC1 includes the first test circuit unit TCi1, the second test circuit unit TCi2, the memory cell array unit MCA, the address decoder AD and the column selector CS.

A chip select signal CS, an output enable signal OE, a write enable signal WE, the scan-in signal SIN, a scan select signal SS, a write control signal WCTRL and a scan clock signal SCLK are input to the memory circuit unit MC1. In addition, the memory circuit unit MC1 outputs a scan-out signal SOUT.

The address decoder AD decodes an address signal a' and outputs an address signal a" with an n-bit width. The address signal a" is input to the first test circuit unit TCi1.

The first test circuit unit TCi1, which receives the scan-in signal SIN, the scan select signal SS and a shift clock signal SCLK in addition to the address signal a", outputs an address signal a'" and the scan-out signal SiOUT1. The address signal a''' is input to the memory cell array unit MCA and the column selector CS, whereas the scan-out signal SiOUT1 is input to the second test circuit unit TCi2. While the scan-in signal SIN is provided from the outside of the LSI 101, an alternative circuit structure, in which the scan-out signal SoOUT1 output by the first external test circuit unit TCo1 is input to the first test circuit unit TCi1 instead of the scan-in signal SIN, may be adopted when the first external test circuit unit TCo1 is included in the peripheral logic circuit LC as shown in FIG. 1.

The second test circuit unit TCi2, to which the scan select signal SS, the write control signal WCTRL and the scan clock signal SCLK are input in addition to the scan-out signal SiOUT1, outputs the scan-out signal SOUT. While the scan-out signal SOUT is output to the outside of the LSI 101, an alternative circuit structure, in which the scan-out signal SOUT is not directly output to the outside but instead is provided to the second external test circuit unit TCo2 as the scan-out signal SiOUT2 may be adopted when the second external test circuit unit TCo2 is included in the peripheral logic circuit LC has shown in FIG. 1.

The column selector CS and the second test circuit unit TCi2 are connected with each other through transmission lines through which input/output data d" and /d" with an m-bit width are transmitted. In addition, the second test circuit unit TCi2 and the memory cell array unit MCA are connected with each other through transmission lines through which input/output data d''' and /d''' with the m-bit width are transmitted.

Figure 3:
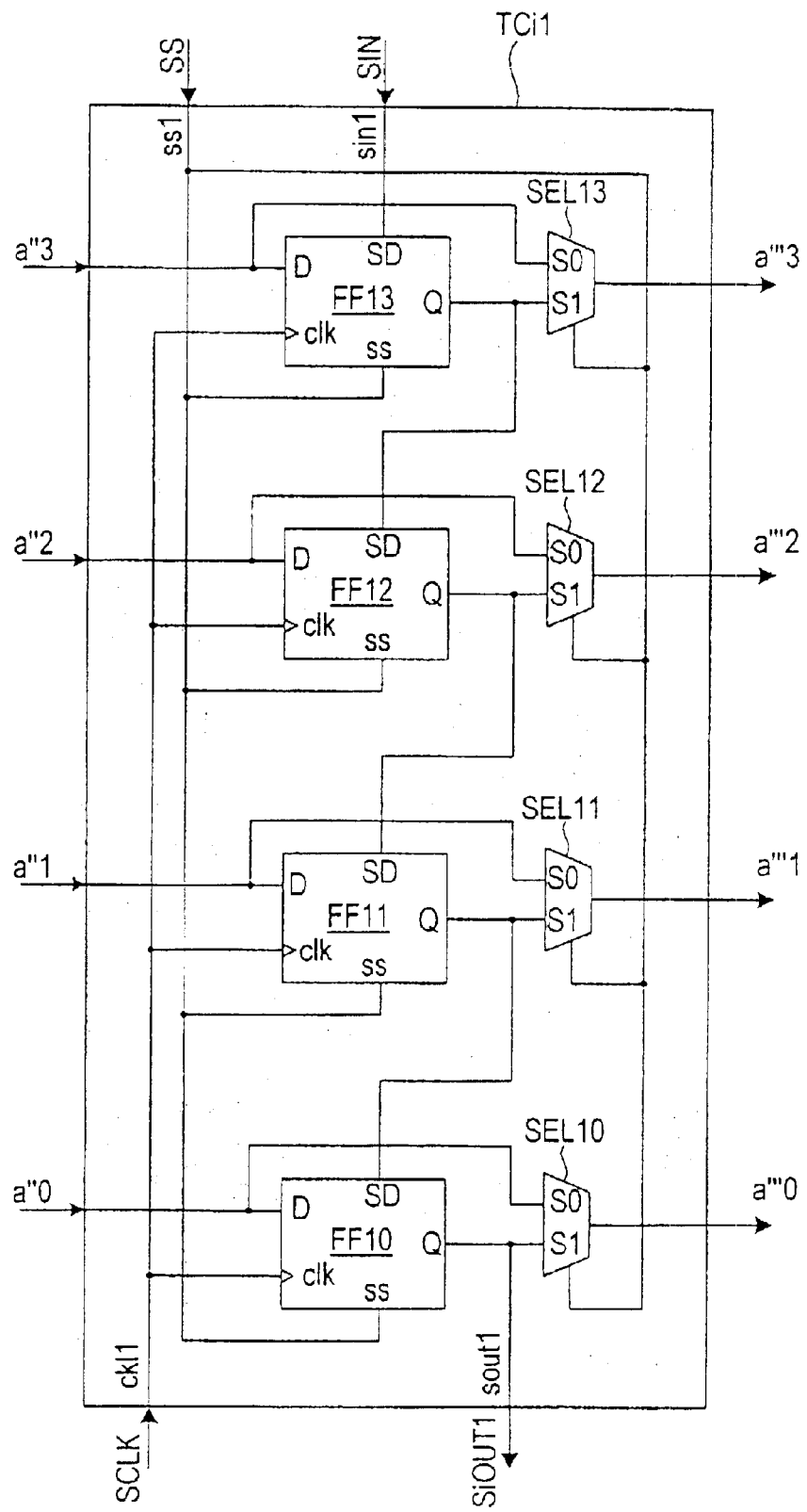
FIG. 3 is a circuit diagram showing the structure of the first test circuit unit included in the memory circuit unit achieved in the first embodiment of the present invention.

As shown in FIG. 3, the first test circuit unit TCi1, to which the address signal a" with the n-bit width is input, outputs the address signal a''' with the n-bit width. The following explanation proceeds by assuming that n=4. The first test circuit unit TCi1 includes flip-flops FF10~FF13 the number (4) of which corresponds to the bit width of the address signal a" and the same number of selectors SEL10~SEL13.

Address signals a"0~a"3 are respectively input to data input ends D of the flip-flops FF10~FF13 and first signal input ends S0 of the selectors SEL10~SEL13. The scan select signal SS is commonly input to scan select signal input ends ss of the individual flip-flops FF10~FF13 and control signal input ends of the individual selectors SEL10~SEL13. The scan clock signal SCLK is commonly input to clock signal input ends clk of the flip-flops FF10~FF13.

Data output ends Q of the individual flip-flops FF10~FF13 are respectively connected to second signal input ends S1 of the selectors SEL10~SEL13. In addition, the data the output ends Q of the flip-flops FF10~FF12 are respectively connected to scan data input ends SD of the flip-flops FF11~FF13 at the succeeding stages. The scan data input end SD of the flip-flop FF13 at the first stage is connected to a scan-in signal input end sin1 to which the scan-in signal SIN is input, whereas the data output end Q of the flip-flop FF10 at the last stage is connected to a scan-out signal output end sout1 through which the scan-out signal SiOUT1 is output.

The individual selectors SEL10~SEL13 respectively select either the address signals a"0~a"3 input to their first signal input ends S0 or the signals output from the data output ends Q of the flip-flops FF10~FF13 and input to the corresponding second signal input ends S1 based upon the logical level of the scan select signal SS, and then output the selected signals as address signals a'"0~a'"3. More specifically, when the can select signal SS indicates a logical low level (hereafter referred to as "L level"), the signals at the first signal input ends S0 are selected, whereas when the scan select signal SS indicates a logical high level (hereafter referred "H level"), the signals at the second signal input ends S1 are selected.

Figure 4:
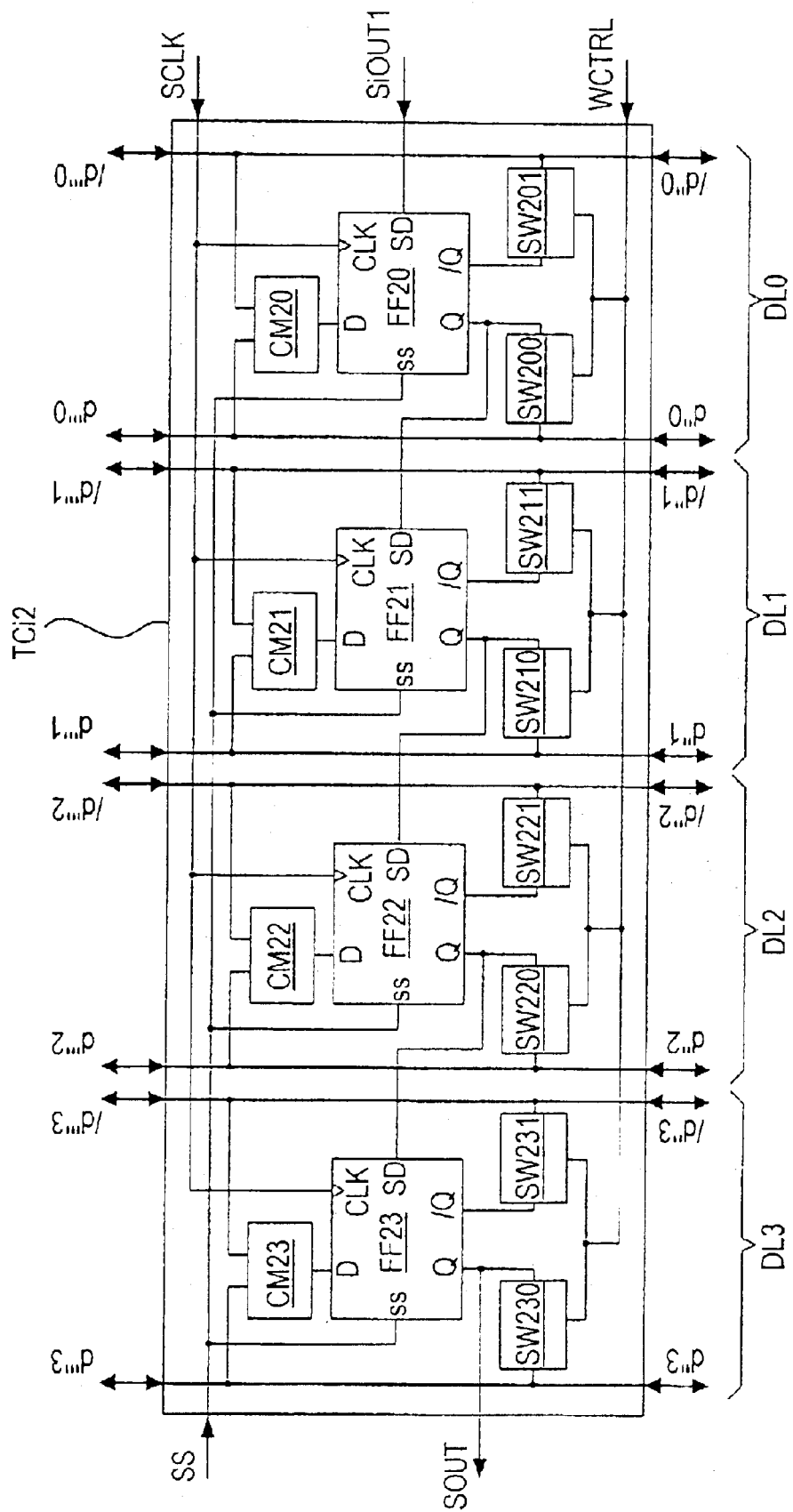
FIG. 4 is a circuit diagram showing the structure of the second test circuit unit included in the memory circuit unit achieved in the first embodiment of the present invention.
Figure 5:
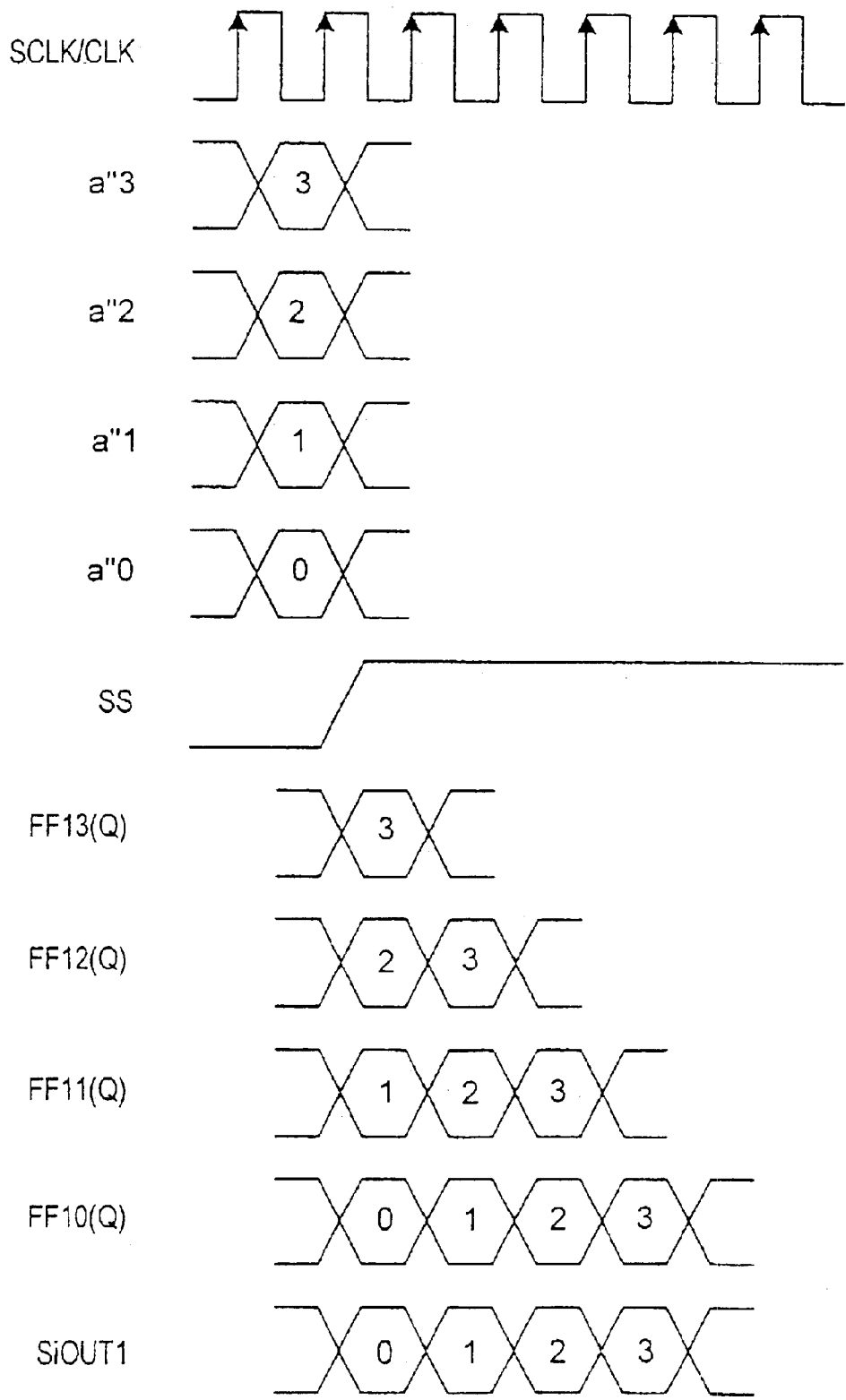
FIG. 5 is a timing chart of the events occurring during the address signal observation mode operation at the first test circuit unit.
Figure 6:
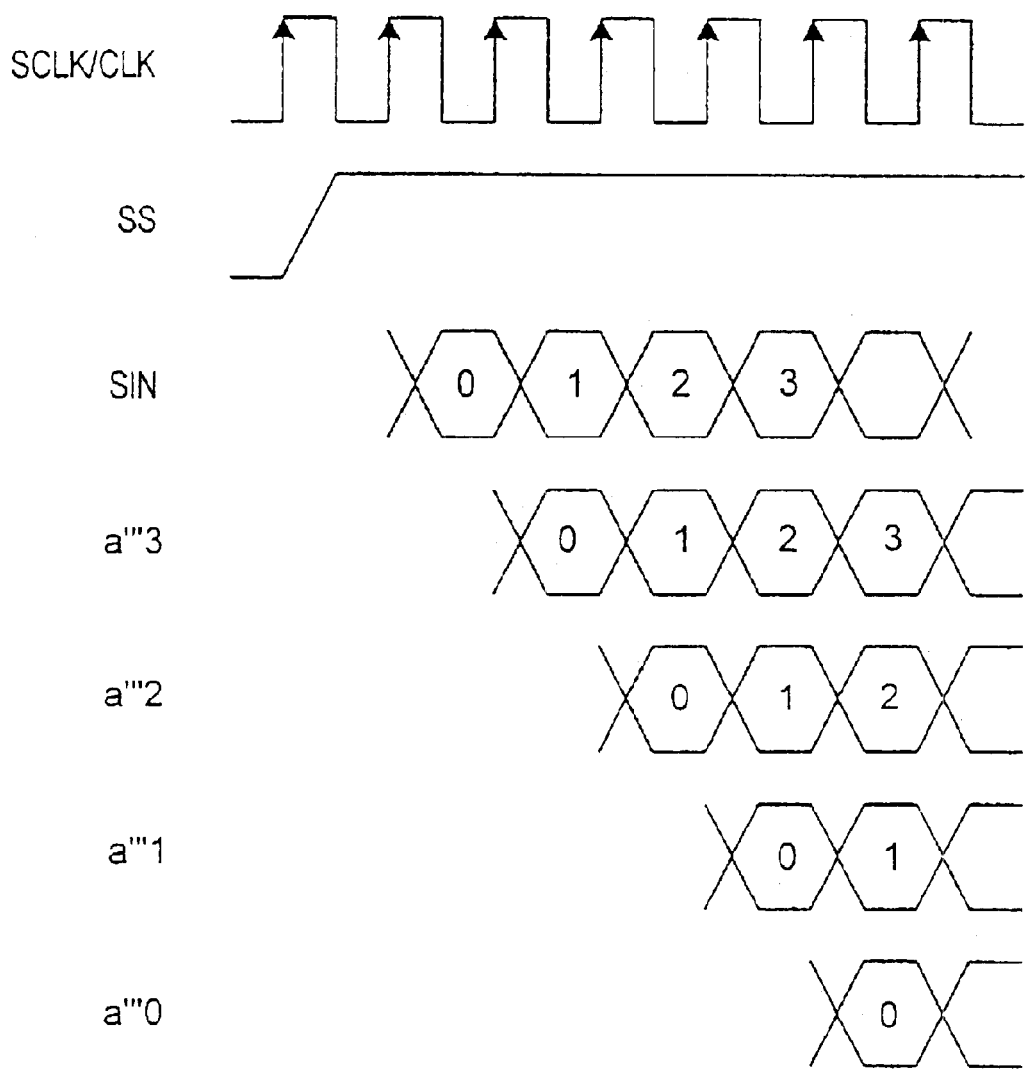
FIG. 6 is a timing chart of the events occurring during the address signal control mode operation at the first test circuit unit.
Figure 7:
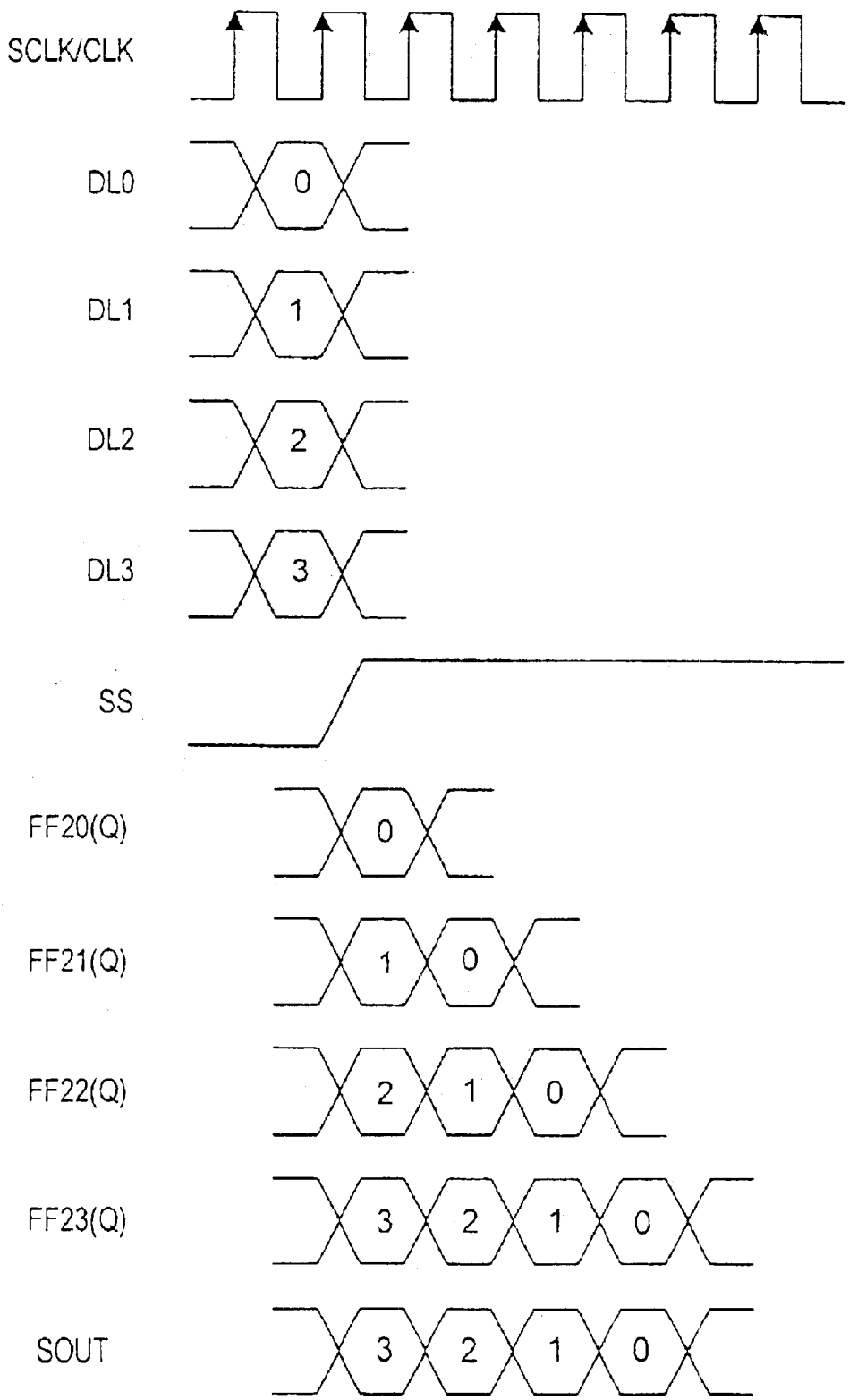
FIG. 7 is a timing chart of the events occurring during the data observation mode operation at the second test circuit unit.
Figure 8:
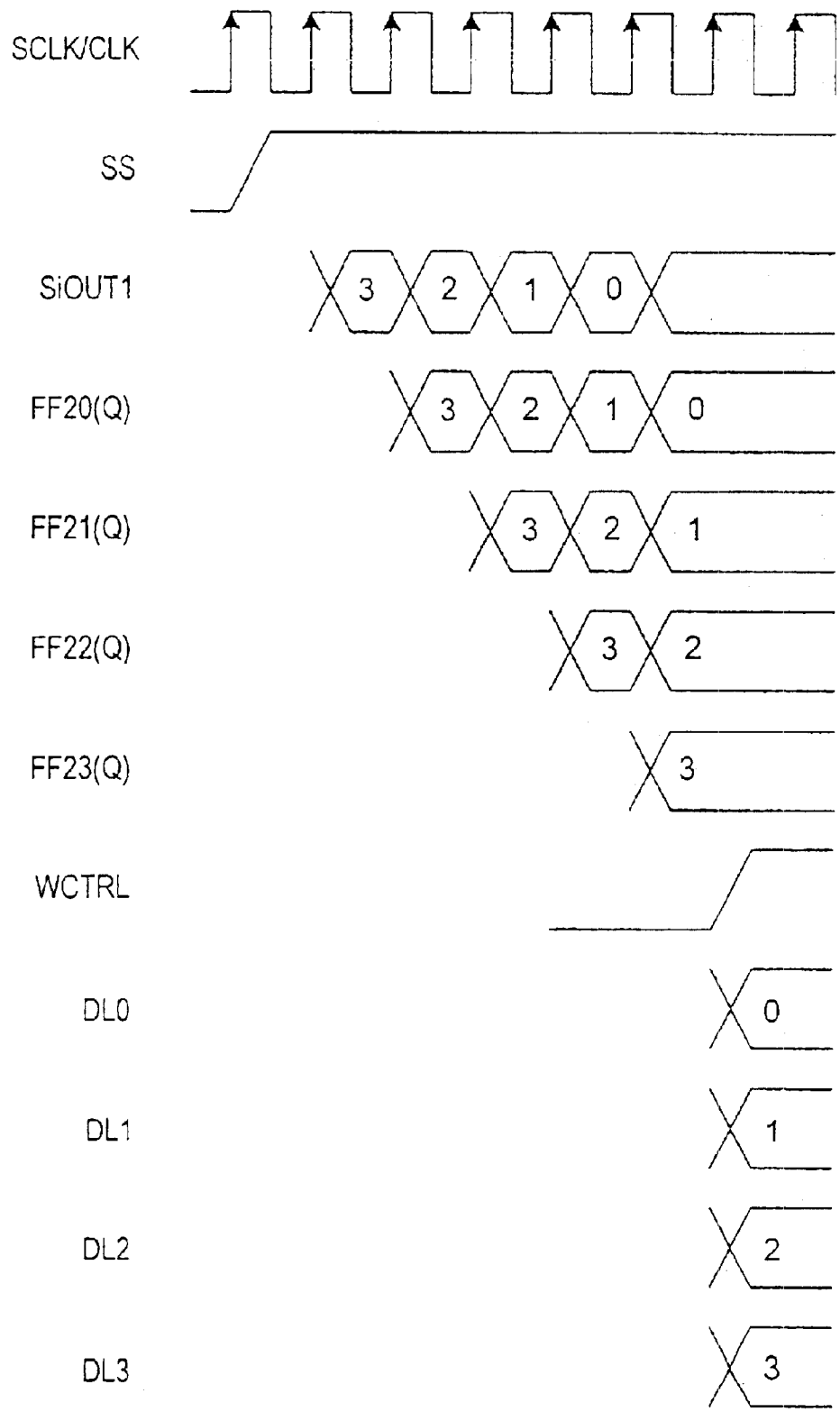
FIG. 8 is a timing chart of the events occurring during the data control mode operation at the second test circuit unit.

Now, the circuit structure adopted in the second test circuit unit TCi2 is explained in reference to FIG. 4. As explained earlier, the second test circuit unit TCi2 is connected with the column selector CS through the transmission lines through which the input/output data d" and /d" with the m-bit width are transmitted, and it is also connected with the memory cell array unit MCA through the transmission lines through which the input/output data d'" and /d'" with the m-bit width are transmitted. The following explanation proceeds by assuming that m=4.

The transmission line between the second test circuit unit TCi2 and the column selector CS through which the input/output data d"0 are transmitted and the transmission line between the second test circuit unit TCi2 and the memory cell array unit MCA through which the input/output data d'"0 are transmitted constitute an integrated transmission line inside the second test circuit unit TCi2. The transmission line through which the input/output data /d"0 that are complementary to the input/output data d"0 are transmitted and the transmission line through which the input/output data /d'"0 that are complementary to the input/output d'"0 are transmitted, too, constitute an integrated transmission line within the second test circuit unit TCi2. These two integrated data transmission lines are referred to as a data transmission line set DL0 in the following explanation.

Likewise, the transmission lines through which the input/output data d"1 and /d"1, d"2 and /d"2, and d"3 and /d"3 are transmitted between the second test circuit unit TCi2 and the column selector CS are respectively integrated with the transmission lines through which the input/output data d'"1 and /d'"1, d'"2 and /d'"2, and d'"3 and /d'"3 are transmitted between the second test circuit unit TCi2 and the memory cell array unit MCA to constitute integrated transmission lines inside the second test circuit unit TCi2. In the following explanation, the individual sets of data transmission lines each having two integrated lines are respectively referred to as data transmission line sets DL1, DL2 and DL3.

The second test circuit unit TCi2 includes four sense amplifiers CM20~CM23, four flip-flops FF20~FF23 and eight switches SW 200, SW 201, SW 210, SW 211, SW 220, SW 221, SW 230 and SW 231, with a set of a single sense amplifier, a single flip-flop and two switches provided in conjunction with each of transmission line sets DL0~DL3. For instance, the sense amplifier CM20, the flip-flop FF20 and the switches SW 200 and SW 201 are provided in conjunction with the data transmission line sets DL0. The circuit structures assumed in the data transmission line sets are similar to one another.

The sense amplifiers CM20~CM23 each detect the potential difference between the two integrated data transmission lines constituting the corresponding data transmission line set DL0, DL1, DL2 or DL3 amplify the detected potential difference and provide the amplified potential difference to the input end D of the corresponding flip-flop FF20, FF21, FF22 or FF23.

The scan clock signal SCLK is commonly input to clock signal input ends elk and the scan select signal SS is commonly input to scan select signal input ends ss at the individual flip-flops FF20~FF23.

The data output end Q of the flip-flop FF20 is connected to a signal input end of the switch SW 200, whereas a data output end /Q of the flip-flop FF20 is connected to a signal input end of the switch SW 201. A signal output end of the switch SW 200 is connected to one of the two integrated data transmission lines constituting the data transmission line set DL0, and a signal output end of the switch SW 201 is connected to the other integrated data transmission line of the two integrated data transmission lines constituting the data transmission line set DL0. It is to be noted that the connections achieved among the flip-flops FF21~FF23, the switches SW 210, SW 211, SW 220, SW 221, SW 230 and SW 231 and the individual data transmission line sets DL1~DL3 are identical to the connections achieved among the flip-flop FF20, switches SW 200 and SW 201 and the data transmission line set DL0.

The data output ends Q of the individual flip-flops FF20~FF22 are respectively connected to the signal input ends of the switches SW 200, SW 210 and SW 220, and are also connected to scan data input ends SD of the flip-flops FF21~FF23 at the succeeding stages respectively. The scan data input end SD of the flip-flop FF20 at the first stage is connected to the scan-in signal input end sin2 to which the scan-out signal SiOUT1 output from the first test circuit unit TCi1 is input. The data output end Q of the flip-flop FF23 at the last stage is connected to the signal input end of the switch SW 230 and is also connected to a scan-out signal output end sout2 through which the scan-out signal SiOUT2 (SOUT) is output.

The first test circuit unit TCi1 and the second test circuit unit TCi2 structured as described above can both be set in either a normal mode or a test mode. The normal mode is selected by setting the scan select signal SS to L level and the write control signal WCTRL to L level.

When the scan select signal SS is set to L level, the individual selectors SEL10~SEL13 in the first test circuit unit TCi1 each selects the first signal input end S0 from the two signal input ends, i.e., the first signal input end S0 and the second signal input end S1, and thus, the selectors SEL10~SEL13 respectively output the address signals a"0~a"3 input to their first signal input ends S0 to the outside as address signals a'"0~a'"3. In other words, in the normal mode, the first test circuit unit TCi1 provides the address signals a" with the n-bit width received from the address decoder AD directly to the memory cell array unit MCA and the column selector CS as the address signals a'" with the n-bit width.

In addition, as the write control signal WCTRL is set to L level, the individual switches SW 200, SW 201, SW 210, SW 211, SW 220, SW 221, SW 230 and SW 231 in the second test circuit unit TCi2 all enter an OFF state and, as a result, the data output ends Q and /Q of the individual flip-flops FF20~FF23 become electrically cut off from the data transmission line sets DL0~DL3. Namely, the second test circuit unit TCi2 does not control the potential levels at the individual data transmission line sets DL0~DL3 and the column selector CS and the memory cell array unit MCA are directly connected with each other through the transmission line sets DL0~DL3 in the normal mode. As a result, the input/output data d" and /d" with the m-bit width at the column selector CS match the input/output data d'" and /d'" with the m-bit width at the memory cell array unit MCA.

Next, the operations of the first test circuit unit TCi1 and the second test circuit unit TCi2 set in the test mode are explained in reference to the timing charts presented in FIGS. 5~8.

In the test mode, the first test circuit unit TCi1 operates either in 1) an observation mode for observing the address signals a" output by the address decoder AD (hereafter referred to as an "address signal observation mode") or 2) a control mode for controlling the address signals a'" provided to the memory cell array unit MCA and the column selector CS (hereafter referred to as an "address signal control mode").

1. Address Signal Observation Mode (See FIG. 5)

When the scan select signal SS is at L level, the data input ends D of the flip-flops FF10~FF13 in the first test circuit unit TCi1 are in an enabled state, whereas the scan data input ends SD are in a disabled state. Thus, the individual flip-flops FF10~FF13 store in memory the address signal a"0~a"3 respectively in synchronization with the rising edge of the scan clock signal SCLK. Then, the data (the address signal a"0) stored in the flip-flop FF10 at the last stage are output as the scan-out signal SiOUT1 from the scan-out signal output end sout1.

Next, as the scan select signal SS shifts to H level, the data input ends D of the flip-flops FF10~FF13 enter a disabled state and the scan data input ends SD of the flip-flops FF10~FF13 enter an enabled state. If the scan clock signal SCLK is input to the first test circuit unit TCi1 in this state, the data stored in the individual flip-flops FF13~FF11 (the address signals a"3~a"1) are respectively transferred and stored into the flip-flops FF12~FF10 at the succeeding stages. Subsequently, each time the scan clock signal SCLK is input to the first test circuit unit TCi1, the flip-flops FF10~FF13 repeat the shift operation and, as a result, the address signals a"0~a"3 are serially output as the scan-out signal SiOUT1.

A verification as to whether or not the address decoder AD is outputting the correct address signals a"0~a"3 can be made by setting the first test circuit unit TCi1 in the address signal observation mode and observing the serial scan-out signal SiOUT1. It is to be noted that the flip-flops FF10~FF13 in the first test circuit unit TCi1 function as a shift register that performs parallel-serial conversion in this mode.

2. Address Signal Control Mode (See FIG. 6)

The scan select signal SS is set to H level. In response, the data input ends D of the flip-flops FF10~FF13 enter a disabled state and the scan data input ends SD of the flip-flops enter an enabled state. If a test address signal is input to the first test circuit unit TCi1 as the scan-in signal SIN in the state, the test address signal is sequentially transferred from the flip-flop FF13 through the flip-flop FF10 starting with the leading bit, every time the scan clock signal SCLK is input. At a time point at which the scan clock signal SCLK has been input over four pulses to the first test circuit unit TCi1, the test address signal is set at the flip-flops FF13~FF10.

Since the scan select signal SS is at H level at this point, the selectors SEL10~SEL13 in the first test circuit unit TCi1 select the data (the test address signal) stored in the individual flip-flops FF10~FF13 and output these data to the outside as the address signals a'"0~a'"3.

To verify the operations and the functions of the memory cell array unit MCA and the column selector CS by providing an arbitrary test address signal to them, the first test circuit unit TCi1 should be set in the address signal control mode and a test address signal should be input to the first test circuit unit TCi1 as the scan-in signal SIN. It is to be noted that the flip-flops FF10~FF13 in the first test circuit unit TCi1 function as a shift register that performs serial-parallel conversion in this mode.

In the test mode, the second test circuit unit TCi2 assumes either 3) an observation mode for observing the input/output data d" and /d" of the column selector CS and the input/output data d'" and /d'" of the memory cell array unit MCA (hereafter referred to as a "data observation mode") or 4) a control mode for controlling the input/output data d" and /d" of the column selector CS and the input/output data d'" and /d'" of the memory cell array unit MCA (hereafter referred to as a "data control mode").

3. Data Observation Mode (See FIG. 7)

First, the memory circuit unit MC1 is set in a data read operation mode by setting the write enable signal WE input to the memory circuit unit MC1 to L level.

When the scan select signal SS is at L level, the data input ends D of the flip-flops FF20~FF23 in the second test circuit unit TCi2 are in an enabled state and the scan data input ends SD of the flip-flops are in a disabled state. Thus, the individual flip-flops FF20~FF23 store in memory the data d'"0 and /d'"0~d'"3 and /d'"3 read out from the memory cell array unit MCA in synchronization with the rising edge of the scan clock signal SCLK. The data d'"3 (/d'"3) stored in the flip-flop FF23 at the last stage are output as the scan-out signal SiOUT2 (SOUT).

Next, as the scan select signal SS shifts to H level, the data input ends D of the flip-flops FF20~FF23 enter a disabled state and the scan data input ends SD of the flip-flops enter an enabled state. If the scan clock signal SCLK is input to the second test circuit unit TCi2 in the state, the data d'"0 (/d'"0)~d'"2 (/d'"2) stored in the flip-flops FF20~FF22 are transferred to and stored in the flip-flops FF21~FF23 respectively at the succeeding stages. Subsequently, each time the scan clock signal SCLK is input to the second test circuit unit TCi2, the flip-flops FF20~FF23 repeats the shift operation and, as a result, the data d'"0 (/d'"0)~d'"3 (/d'"3) are serially output as the scan-out signal SiOUT2 (SOUT).

A verification as to whether or not the data d'"0 (/d'"0) ~d'"3 (/d'"3) as expected have been read out from the memory cell array unit MCA can be made by setting the second test circuit unit TCi2 in the data observation mode and observing the serial scan-out signal SiOUT2 (SOUT). It is to be noted that the flip-flops FF20~FF23 in the second test circuit unit TCi2 function as a shift register that performs parallel-serial conversion in this mode.

4. Data Control Mode (See FIG. 8)

First, the write enable signal WE input to the memory circuit unit MC1 is adjusted to either L level or H level. To conduct a test in which test data are provided from the second test circuit unit TCi2 to the column selector CS, the memory circuit unit MC1 should be set in the data read it operation mode by setting the write enable signal WE to L level. To conduct a test in which the test data from the second test circuit unit TCi2 are written into the memory cell array unit MCA, on the other hand, the memory circuit unit MC1 should be set in the data write operation mode by setting the write enable signal WE to H level.

Next, the scan select signal SS is set to H level. In response, the data input ends D of the flip-flops FF20~FF23 enter a disabled state and the scan data input ends SD of the flip-flops enter an enabled state. If the test data are input as the scan-in signal SIN to the second test circuit unit TCi2 in this state, the test data are sequentially transferred from the flip-flop FF20 through the flip-flop FF23 starting with the leading bit, each time the scan clock signal SCLK is input. At a time point at which the scan clock signal SCLK has been input over four pulses to the second test circuit unit TCi2, the test data are set at the flip-flops FF20~FF23. It is to be noted that when the second test circuit unit TCi2, together with the first test circuit unit TCi1, forms a scan path as shown in FIG. 2, the test data are input to the second test circuit unit TCi2 as the scan-out signal SiOUT1 via the first test circuit unit TCi1.

Next, the write control signal WCTRL is shifted from L level to H level. Thus, the switches SW 200, SW 201, SW 210, SW 211, SW 220, SW 221, SW 230 and SW 231 in the second test circuit unit TCi2 all enter an ON state, and the test data stored in the individual flip-flops FF20~FF23 are output to the data transmission line sets DL0~DL3 respectively. If the write enable signal WE is at L level at this point, the test data output to the data transmission line sets DL0~DL3 are input to the column selector CS. If, on the other hand, the write enable signal WE is at H level, the test data output to the data transmission line sets DL0~DL3 are input to the memory cell array unit MCA.

To verify the operations and functions of the memory cell array unit MCA and the column selector CS by providing arbitrary test data to them, the second test circuit unit TCi2 should be set in the data control mode and the test data should be input to the second test circuit unit TCi2 as the scan-in signal SIN. It is to be noted that the flip-flops FF20~FF23 in the second test circuit unit TCi2 function as a shift register that performs serial-parallel conversion in this mode.

As is obvious from the explanation given so far, the first test circuit unit TCi1 provided within the memory circuit unit MC1 in the embodiment enables a function test to be conducted on the decoder logic unit within the memory circuit unit MC1. In addition, the second test circuit unit TCi2 provided within the memory circuit unit MC1 in the embodiment enables a function test to be conducted on the selector logic unit within the memory circuit unit MC1. Furthermore, by providing both the first test circuit unit TCi1 and the second test circuit unit TCi2 in the memory circuit unit MC1, it becomes possible to write data into and read data from the memory cell array unit directly (direct access) by bypassing the logic circuit.

(Second Embodiment)

The first test circuit unit TCi1 and the second test circuit unit TCi2 provided in the memory circuit unit MC1 in the first embodiment may be utilized in a synchronous memory circuit MC2 (see FIG. 9) as well as in the memory circuit unit MC1 (see FIG. 2) which is an asynchronous memory circuit unit. To utilize the first test circuit unit TCi1 and the second test circuit unit TCi2 within the asynchronous memory circuit unit MC1, the scan clock signal SCLK must be input to the memory circuit unit MC1. In contrast, the test circuit units may be utilized within the synchronous memory circuit unit MC2 by using a clock signal CLK, which is provided as an operation reference for the memory circuit unit MC2 as an operation reference for the individual test circuit units as well. For this reason, it is no longer necessary to input the scan clock signal SCLK to the memory circuit unit MC2.

(Third Embodiment)

The structure and the operation of a third test circuit unit TCi3 provided in a memory circuit unit MC3 in the third embodiment of the present invention are now explained in reference to FIGS. 10~14.

Figure 9:
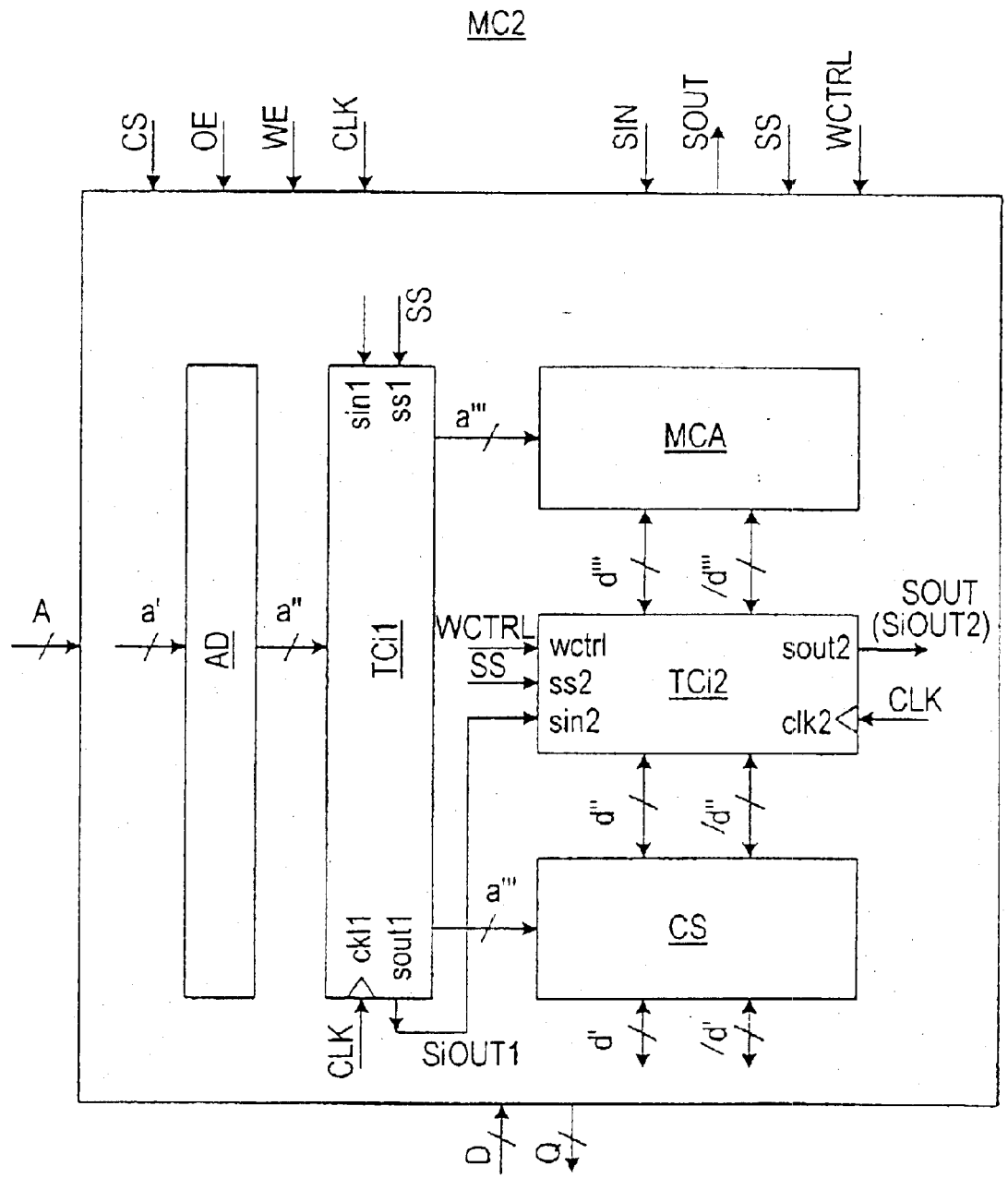
FIG. 9 is a block diagram showing the structure of the memory circuit unit achieved in a second embodiment of the present invention.
Figure 10:
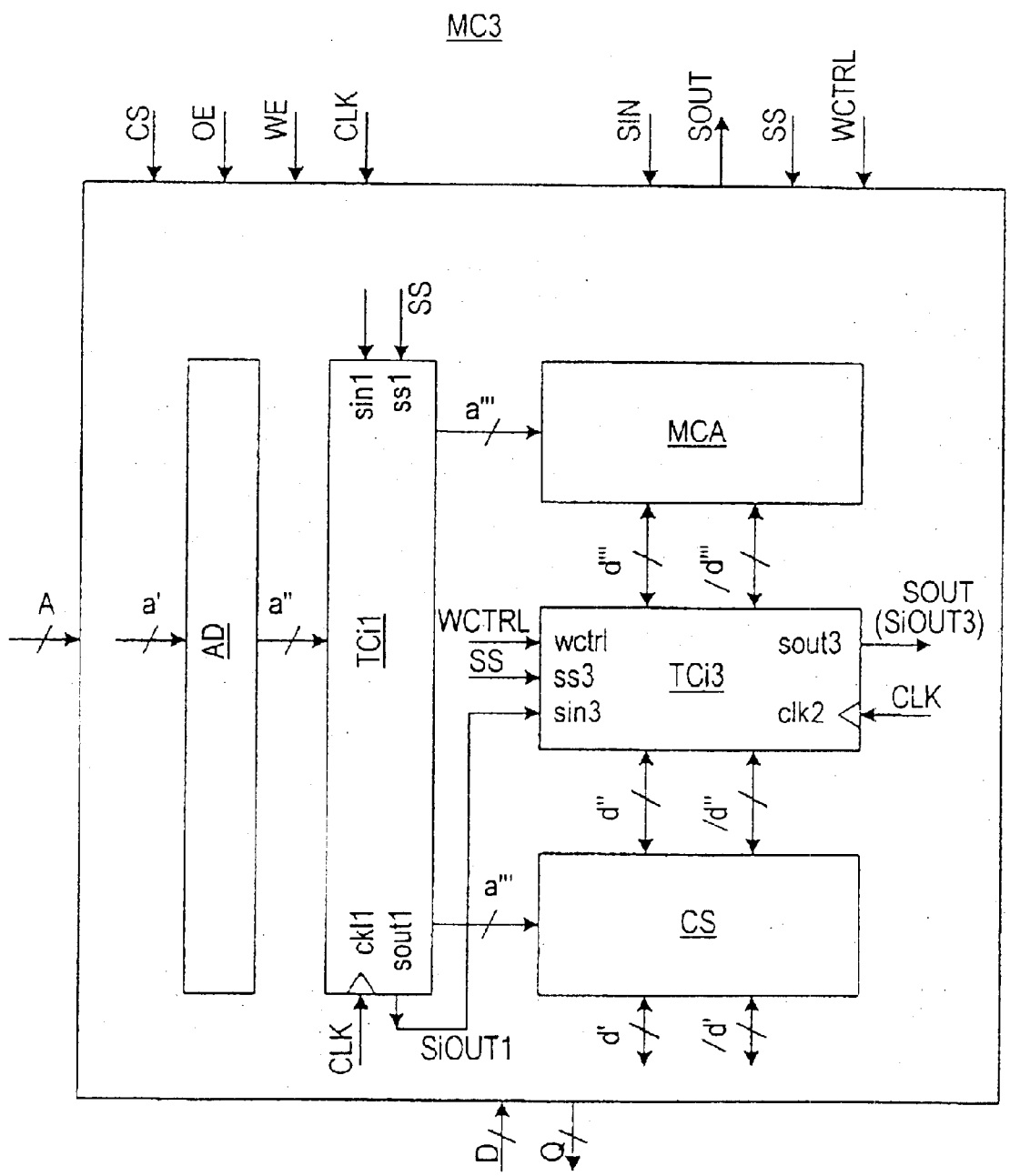
FIG. 10 is a block diagram showing the structure of the memory circuit unit achieved in a third embodiment of the present invention.

The third test circuit unit TCi3 shown in FIG. 10 achieves functions substantially identical to those of the second test circuit unit TCi2 included in the memory circuit units MC1 and MC2 in the first and second embodiments respectively shown in FIGS. 2 and 9. The third test circuit unit TCi3, to which the scan-out signal SiOUT1 output from the first test circuit unit TCi1, the scan select signal SS, the write control signal WCTRL and the clock signal CLK are input, outputs a scan-out signal SOUT. While the scan-out signal SOUT is output to the outside of the LSI 101, an alternative circuit structure in which the scan-out signal is not directly output to the outside but instead is provided to the second external test circuit unit TCo2 as the scan-out signal SiOUT3 may be adopted when the second external test circuit unit TCo2 is included in the peripheral logic circuit LC as shown in FIG. 1.

Figure 11:
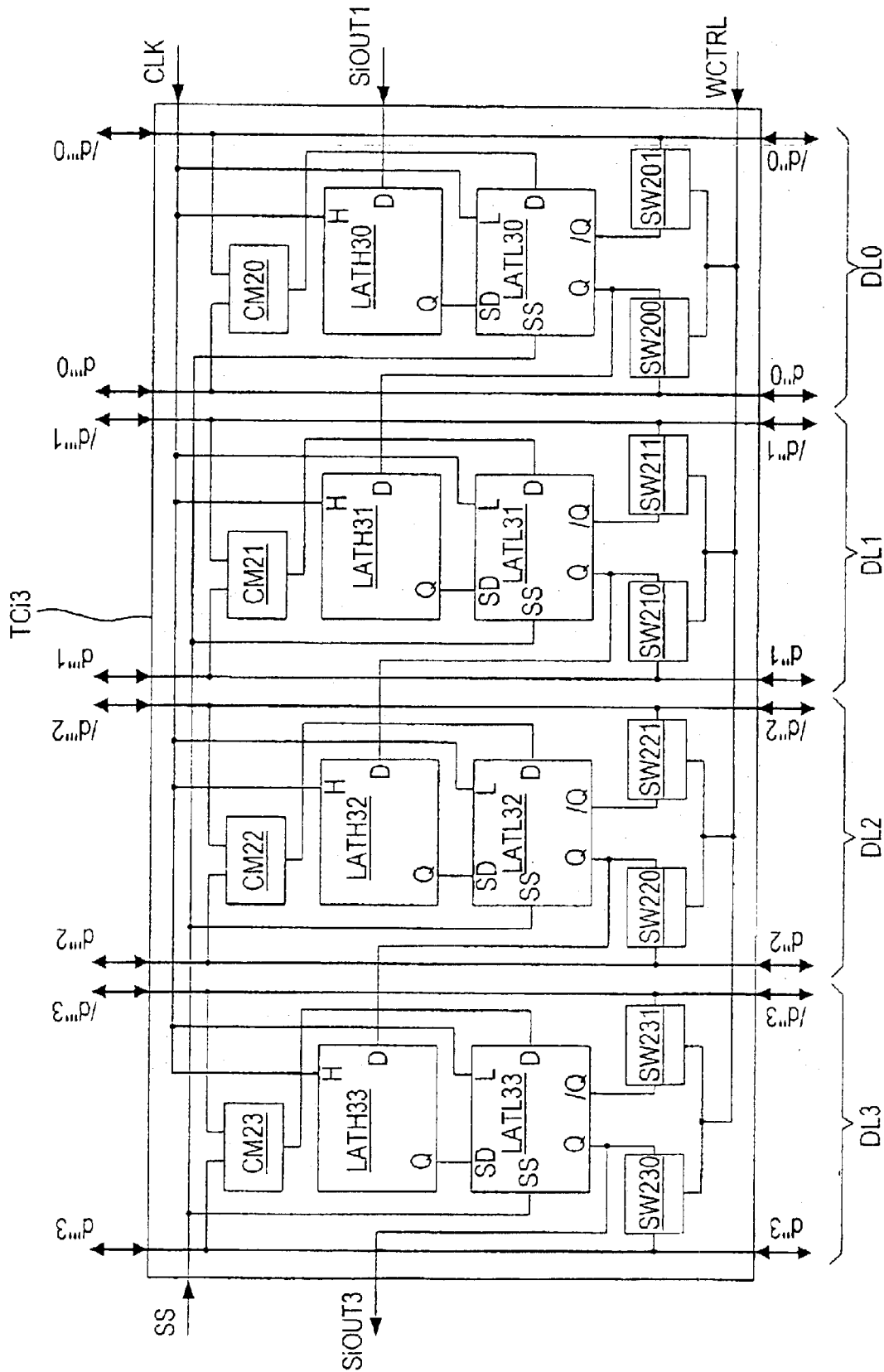
FIG. 11 is a circuit diagram showing the structure of the third test circuit unit included in the memory circuit unit achieved in the third embodiment of the present invention.

The circuit structure adopted in the third test circuit unit TCi3 is shown in FIG. 11. The third test circuit unit TCi3 assumes a circuit structure achieved by replacing the flip-flops FF20~FF23 in the second test circuit unit TCi2 shown in the FIG. 4 with H-through latches LATH30~LATH33 and L-through latches LATL30~LATL33 respectively. Other components of the third test circuit unit TCi3 are substantially identical to those of the second test circuit unit TCi2.

While a signal set at H level is input to control signal input ends H of the H-through latches LATH30~LATH33, the H-through latches each output to the data output end Q a signal indicating a logical level matching the logical level of the signal input to the data input end D (data through), whereas while a signal set at L level is input to the control signal input ends H, the H-through latches each latch the signal input to the data input end D (data latch).

While a signal set at L level is input to control signal input ends L of the L-through latches LATL30~LATL33, the L-through latches LATL30~LATL33 each output to the data output end Q signals indicating a logical level matching the logical level of the signal input to the data input end D or the scan data input end SD and also, they each output a complementary signal to the data output end /Q (data through), whereas while a signal set at H level is input to the control signal input ends L, the L-through latches each latch the signal input to the data input end D or the signal input to the scan data input end SD (data latch).

The third test circuit unit TCi3 includes four sense amplifiers CM20~CM23, the four H-through latches LATH30~LATH33, the four L-through latches LATL30~LATL33 and eight switches SW 200, SW 201, SW 210, SW 211, SW 220, SW 221, SW 230 and SW 231, with a set of: a single sense amplifier, a single H-through latch, a single L-through latch and two switches provided in conjunction with each of transmission line sets DL0~DL3. For instance, the sense amplifier CM20, the H-through latch LATH30, the L-through latch LATL30 and the switches SW 200 and SW 201 are provided in conjunction with the data transmission line sets DL0. The circuit structures assumed in the data transmission line sets DL0~DL3 are identical to one another.

The sense amplifiers CM20~CM23 each detect the potential difference between the two integrated data transmission lines constituting the corresponding data transmission line set DL0, DL1, DL2 or DL3 amplify the detected potential difference and provide the amplified potential difference to the data input end D of the corresponding L-through latch LATL30, LATL31, LATL32 or LATL33.

The clock signal CLK is commonly input to the control signal input ends H of the H-through latches LATH30~LATH33. The data output ends Q of the H-through latches LATH30~LATH33 are respectively connected to the scan data input ends SD of the L-through latches LATL30~LATL33. The clock signal CLK is commonly input to the control signal input ends L of the L-through latches LATL30~LATL33, and the scan select signal SS is commonly input to the scan select signal input ends ss of the L-through latches.

The data output end Q of the L-through latch LATL30 is connected to a signal input end of the switch SW 200, whereas the data output end /Q of the L-through latch LATL30 is connected to the signal input end of the switch SW 201. A signal output end of the switch SW 200 is connected to one of the two integrated data transmission lines constituting the data transmission line set DL0, and a signal output end of the switch SW 201 is connected to the other integrated data transmission line of the two integrated data transmission lines constituting the data transmission line set DL0. It is to be noted that the connections achieved among the L-through latches LATL30~LATL33, the switches SW 210, SW 211, SW 220, SW221, SW230 and SW231 and the individual data transmission line sets DL0~DL3 are identical to the connections achieved among the L-through latch LATL30, the switches SW 200 and SW 201 and the data transmission line set DL0.

The data output ends Q of the individual L-through latches LATL30~LATL32 are respectively connected to the signal input ends of the switches SW 200, SW 210 and SW 220, and are also connected to the data input ends D of the H-through latches LATH 31~LATH 33 at the succeeding stages respectively. The data input end D of the H-through latch LATH 30 at the first stage is connected to a scan-in signal input end sin3 to which the scan-out signal SiOUT1 output from the first test circuit unit TCi1 is input. The data output end Q of the L-through latch LATL33 at the last stage is connected to the signal input end of the switch SW 230 and is also connected to a scan-out signal output end sout3 through which the scan-out signal SiOUT3 (SOUT) is output.

The third test circuit unit Tci3 structured as described above can be set in either the normal mode or the test mode. The normal mode is selected by setting the write control signal WCTRL to L level.

When the write control signal WCTRL is set to L level, the switches SW 200, SW201, SW 210, SW 211, SW 220, SW 221, SW 230 and SW 231 in the third test circuit unit TCi3 all enter an OFF state, and, as a result, the data output ends Q and /Q of the individual L-through latches LATL30~LATL33 become electrically cut off from the data transmission line sets DL0~DL3 respectively. Namely, the third test circuit unit TCi3 does not control the potential levels at the individual data transmission line sets DL0~DL3 in the normal mode and, as a result, the column selector CS and the memory cell array unit MCA are directly connected with each other through the data transmission line sets DL0~DL3. Consequently, the input/output data d" and /d" with the m-bit width at the column selector CS and the input/output d'" and /d'" with the m-bit width at the memory cell array unit MCA match each other.

Figure 12:
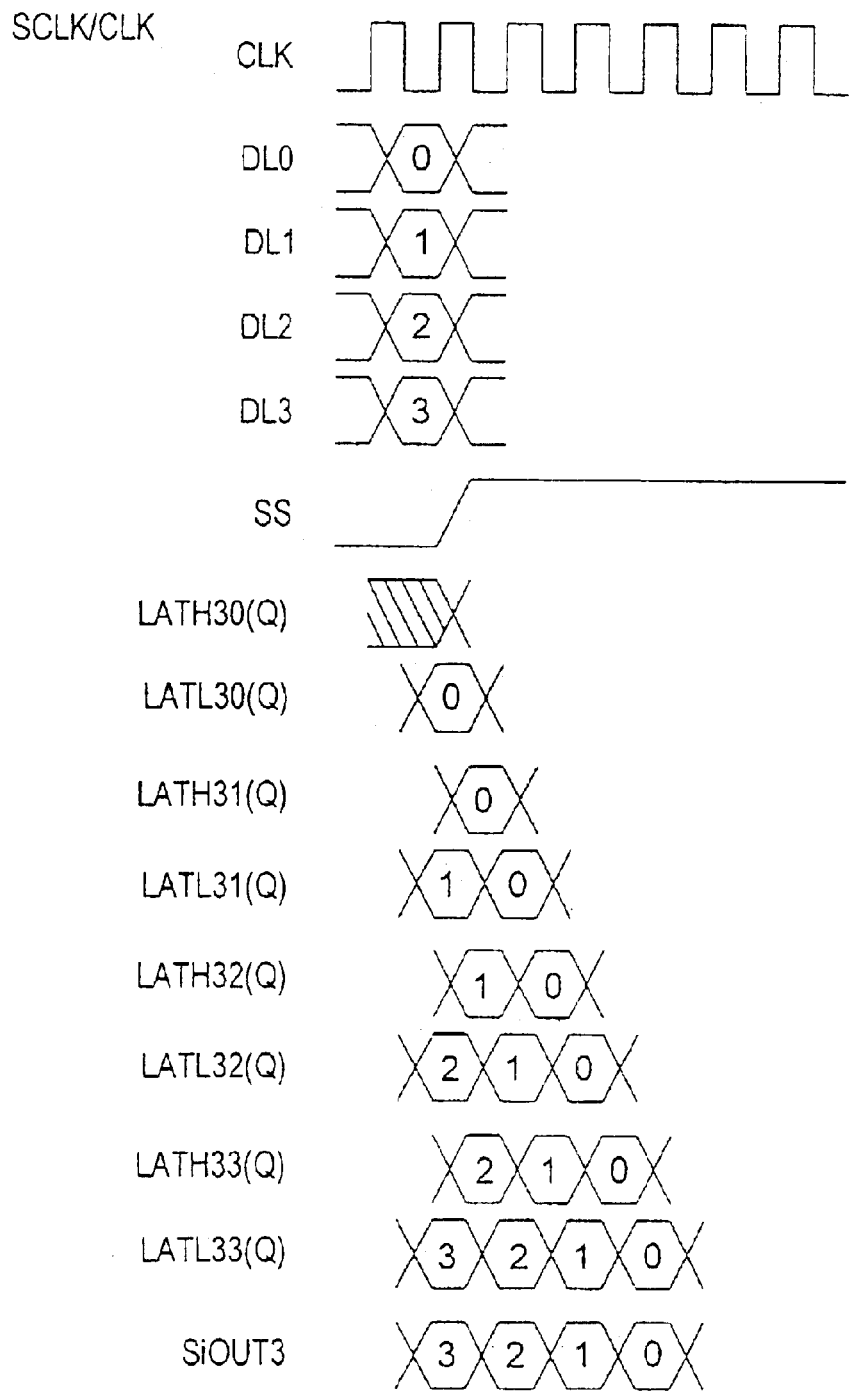
FIG. 12 is a timing chart of the events occurring during the data observation mode operation at the third test circuit unit.
Figure 13:
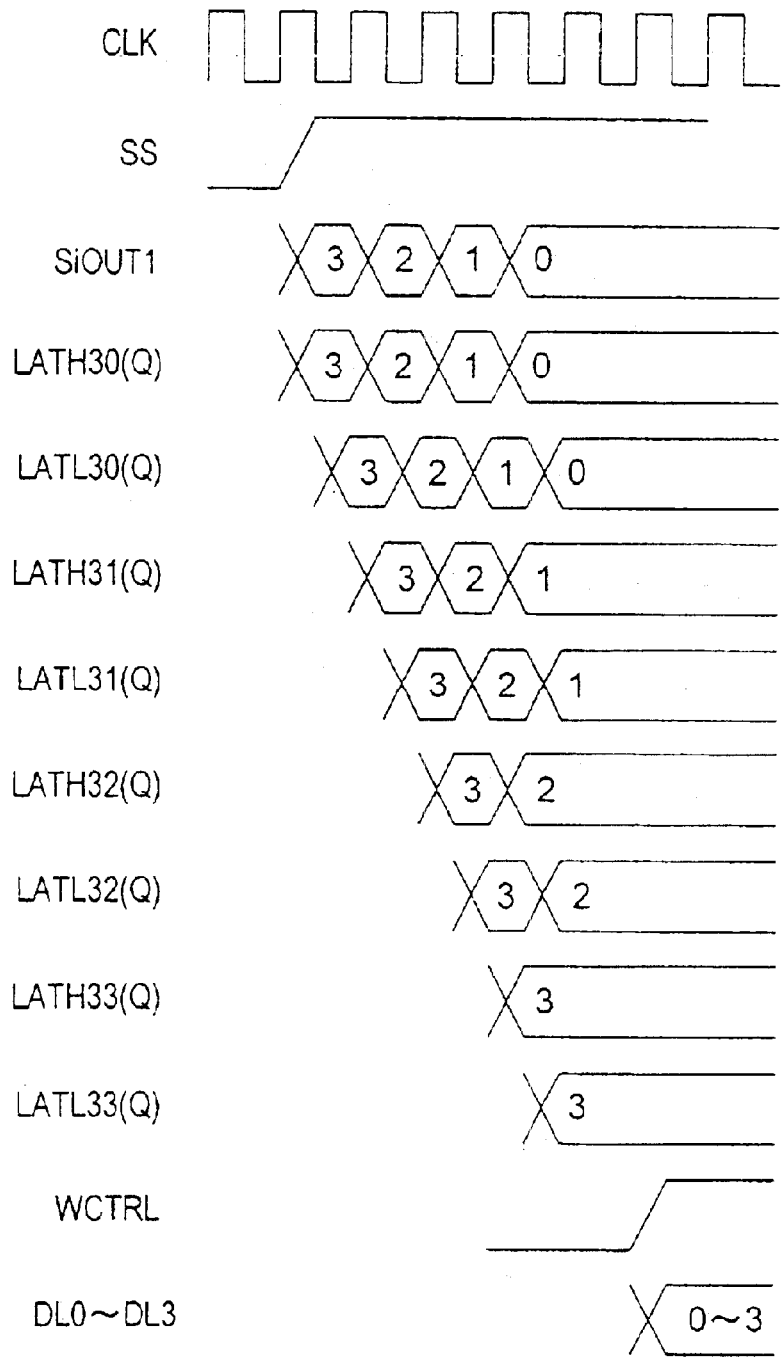
FIG. 13 is a timing chart of the events occurring during the data control mode operation at the third test circuit unit.

Next, the operation of the third test circuit unit TCi3 is explained in reference to the timing charts presented in FIGS. 12 and 13.

In the test mode, the third test circuit unit TCi3 assumes either 5) an observation mode for observing the input/output data d" and /d" of the column selector CS and the input/output data d'" and /d'" of the memory cell array unit MCA (hereafter referred to as a "data observation mode") or 6) a control mode for controlling the input/output data d" and /d" of the column selector CS and the input/output data d'" and /d'" of the memory cell array unit MCA (hereafter referred to as a "data control mode").

5. Data Observation Mode (see FIG. 12)

First, the memory circuit unit MC3 is set in the data read operation mode by setting the write enable signal WE input to the memory circuit unit MC3 to L level.

When the scan select signal SS is at L level, the data input ends D of the L-through latches LATL30~LATL33 in the third test circuit unit TCi3 are in an enabled state and the scan data input ends SD of the L-through latches are in a disabled state. Thus, the individual L-through latches LATL30 ~LATL33 latch the data d'"0 and /d'"0 d'"3 and /d'''3 respectively read out from the memory cell array unit MCA when the clock signal CLK is at H level. The data d'''3 (/d'''3) stored in the L-through latch LATL 33 at the last stage are output as the scan-out signal SiOUT3 (SOUT).

Next, as the scan select signal SS shifts to H level, the data input ends D of the L-through latches LATL30~LATL33 enter a disabled state and the scan data input ends SD of the L-through latches enter an enabled state.

Since the data output ends Q of the individual L-through latches LATL30~LATL32 are respectively connected to the data input ends D of the H-through latches LATH 31~LATH 33 at the succeeding stages, the data d'''0 and /d'''0~d'''2 and /d'''2 latched at the L-through latches LATL30~LATL32 are respectively latched by the H-through latches LATH 31~LATH 33 when the clock signal CLK shifts to L level next.

As the clock signal CLK shifts to H level next, the data d'''0 and /d'''0~d'''2 and /d'''2 latched at the H-through latches LATH 31~LATH 33 are latched by the L-through latches LATL31~LATL33 at the same stages respectively. The data d'''2 (/d'''2) stored at the L-through latch LATL 33 at the last stage are then output as the scan-out signal SiOUT3 (SOUT). Subsequently, each time the clock signal CLK is input to the third test circuit unit TCi3, the H-through latches LATH 30~LATH 33 and the L-through latches LATL30~LATL33 repeat the shift operation and, as a result, the data d'''0 (/d'''0)~d'''3 (/d'''3) are serially output as the scan-out signal SiOUT3 (SOUT).

A verification as to whether or not the data d'''0 (/d'''0) ~d'''3 (/d'''3) as expected have been read out from the memory cell array unit MCA can be made by setting the third test circuit unit TCi3 in the data observation mode and observing the serial scan-out signal SiOUT3 (SOUT). It is to be noted that the H-through latches LATH 30~LATH 33 and the L-through latches LATL30~LATL33 in the third test circuit unit TCi3 function as a shift register which performs parallel-serial conversion in this mode.

6. Data Control Mode (See FIG. 13)

First, the write enable signal WE input to the memory circuit unit MC3 is adjusted to either L level or H level. To conduct a test in which test data are provided from the third test circuit unit TCi3 to the column selector CS, the memory circuit unit MC3 should be set in the data read it operation mode by setting the write enable signal WE to L level. To conduct a test in which the test data from the third test circuit unit TCi3 are written into the memory cell array unit MCA, on the other hand, the memory circuit unit MC3 should be set in the data write operation mode by setting the write enable signal WE to H level.

Next, the scan select signal SS is set to H level. In response, the data input ends D of the L-through latches LATL30~LATL33 enter a disabled state and the scan data input ends SD of the L-through latches enter an enabled state. If the test data are input to the third test circuit unit TCi3 as the scan-in signal SIN in this state, the first bit data in the scan-in signal SIN are latched by the H-through latch LATH30 at the first stage when the clock signal CLK is at L level. Next, as the clock signal CLK shifts to H level, the first bit data in the scan-in signal SIN latched at the H-through latch LATH 30 are latched by the L-through latch LATL 30 at the same stage. Subsequently, each time the clock signal CLK is input, the test data are sequentially transferred to the H-through latch LATH 31 to the L-through LATH 31 to the L-through latch LATL 32 to the H-through latch LATH 33 and to the L-through latch LATL 33. At a time point at which the clock signal CLK has been input to the third test circuit unit TCi3 over four pulses, the test data become set at the L-through latches LATL30~LATL33. It is to be noted that when the third test circuit unit TCi3, together with the first test circuit unit TCi1, forms a scan path as shown in FIG. 10, the test data are input to the third test circuit unit TCi3 as the scan-out signal SiOUT1 via the first test circuit unit TCi1.

Next, the write control signal WCTRL is shifted from L level to H level. Thus, the switches SW 200, SW 201, SW 210, SW 211, SW 220, SW 221, SW 230 and SW 231 in the third test circuit unit TCi3 all enter an ON state, and the test data stored in the individual L-through latches LATL30~LATL33 are output to the data transmission line sets DL0~DL3 respectively. If the write enable signal WE is at L level at this point, the test data output to the data transmission line sets DL0~DL3 are input to the column selector CS. If, on the other hand, the write enable signal WE is at H level, the test data output to the data transmission line sets DL0~DL3 are input to the memory cell array unit MCA.

To verify the operations and functions of the memory cell array unit MCA and the column selector CS by providing arbitrary test data to them, the third test circuit unit TCi3 should be set in the data control mode and the test data should be input to the third test circuit unit TCi3 as the scan-in signal SIN. It is to be noted that the H-through latches LATH30~LATH33 and the L-through latches LATL30~LATL33 in the third test circuit unit TCi3 function as a shift register that performs serial-parallel conversion in this mode.

As is obvious from the explanation given above, the third test circuit unit TCi3 provided within the memory circuit unit MC3 in the embodiment enables a function test to be conducted on the selector logic unit within the memory circuit unit MC3. In addition, by providing both the first test circuit unit TCi1 in the memory circuit unit MC1 or MC2 in the first or second embodiment and the third test circuit unit TCi3 within the memory circuit unit MC3, it becomes possible to write data into and read data from the memory cell array unit directly (direct access) by bypassing the logic circuit.

Figure 14:
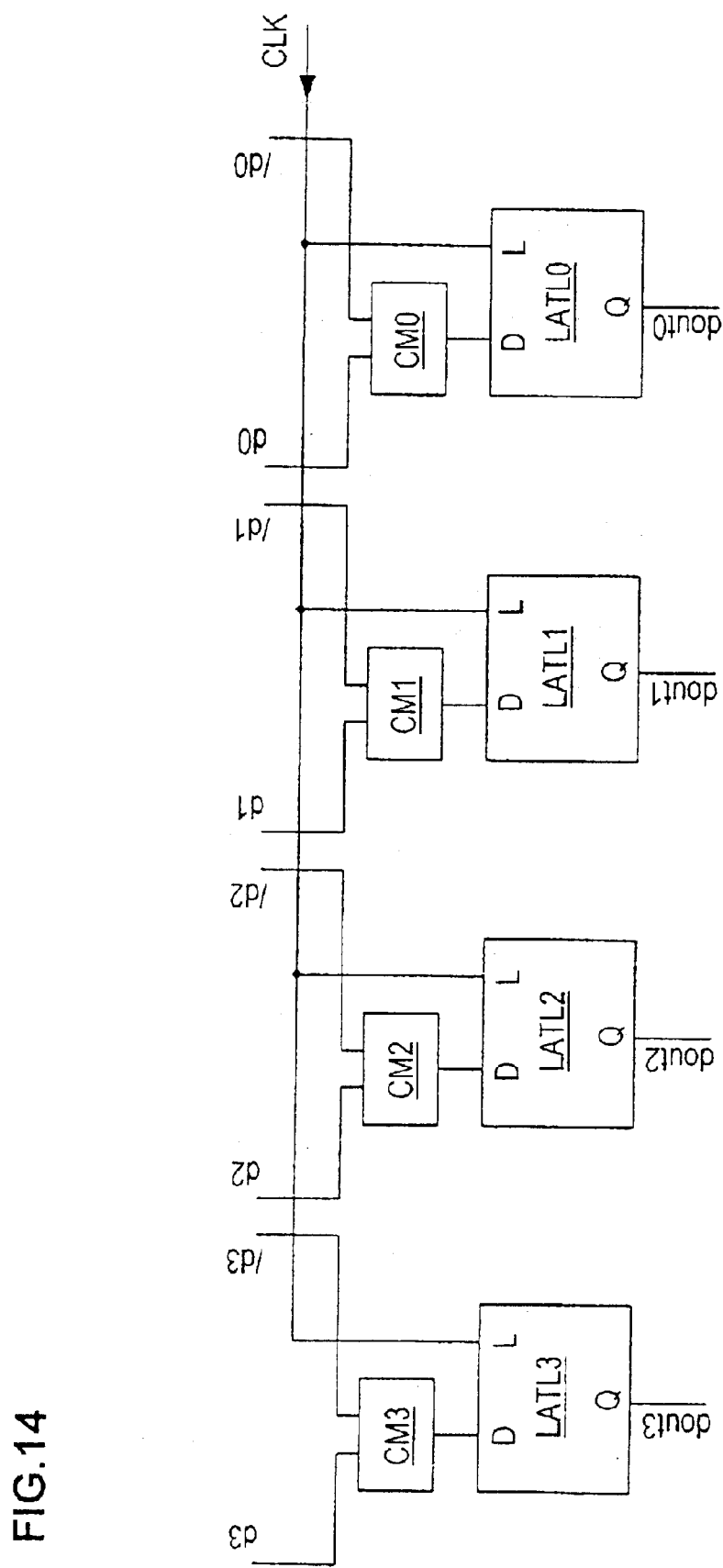
FIG. 14 is a circuit diagram of the data output unit in a standard output latch-type memory circuit.

When a memory circuit adopts an output latch structure, sense amplifiers (comparators) CM0~CM3 and L-through latches LATL0~LATL3 are provided at the transmission lines through which data are read out from the memory cell array unit MCA, as shown in FIG. 14. If the third test circuit unit TCi3 is to be included in this output latch type memory circuit, the sense amplifiers CM20~CM23 constituting the third test circuit unit TCi3 should be integrated with the sense amplifiers CM0~CM3 respectively and the L-through latches LATL30~LATL33 constituting the third test circuit unit TCi3 should be integrated with the L-through latches LATL0~LATL3 respectively. By adopting such a structure in the memory circuit, the increase in the circuit layout area, which is bound to occur when a test circuit is added in the structure, can be minimized.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

While FIG. 1 shows the LSI 101 having a scan path formed by the first external test circuit unit TCo1, the second external test circuit unit TCo1, the first test circuit unit TCi1 and the second test circuit unit TCi2, the individual test circuits may be provided as units independent of one another. In such a case, the scan-in signal SIN should be provided to each test circuit so as to obtain a scan-out signal SOUT from each of the test circuits. For instance, the LSI may include a scan-in signal input end and a scan-out signal output for each test circuit. Alternatively, a single scan-in signal input end and a single scan out output end may be provided, as shown in FIG. 1, with a flag bit for identifying each test circuit and the operation mode (the observation mode or the control mode) assumed at the test circuit added into the scan-in signal and the scan-out signal. In such a case, the memory circuit may include a logic circuit that analyzes the flag bit in the scan-in signal and adds a flag bit into the scan-out signal.

What is claimed is:

1. A semiconductor memory device comprising:

a memory cell array unit constituted of a plurality of memory cells in which data are stored;

an address signal generating unit that generates an address signal with an n-bit width to specify one or a plurality of memory cells among said plurality of memory cells; and an address signal test circuit unit that converts the address signal with the n-bit width output from the address signal generating unit to a serial signal for address signal observation and outputs the serial signal resulting from the conversion.

2. A semiconductor memory device according to claim 1, wherein:

the address signal test circuit unit includes a shift register.

3. A semiconductor memory device according to claim 2, wherein:

said shift register is constituted of n flip-flops.

4. A semiconductor memory device comprising:

a memory cell array unit constituted of a plurality of memory cells in which data are stored;

an address signal generating unit that generates an address signal with an n-bit width to specify one or a plurality of memory cells among said plurality of memory cells; and an address signal test circuit unit converting a test address serial signal provided from the outside to a test address signal with the n-bit width and the address signal test circuit unit taking in the address signal from the address signal generating unit and providing either the test address signal or the address signal to said memory cell array unit.

5. A semiconductor memory device comprising:

a memory cell array unit constituted of a plurality of memory cells in which data are stored;

an address signal generating unit that generates an address signal with an n-bit width to specify one or a plurality of memory cells among said plurality of memory cells; and an address signal test circuit unit converting the address signal with the n-bit width output from the address signal generating unit to a serial signal for address signal observation and outputting the serial signal resulting from the conversion, the address signal test circuit unit converting a test address serial signal provided from the outside to a test address signal with the n-bit width and the address signal test circuit unit taking in the address signal from the address signal generating unit and providing either the test address signal or the address signal to said memory cell array unit.

6. A semiconductor memory device comprising:

a memory cell array unit constituted of a plurality of memory cells in which data are stored;

a data input/output unit outputting data with an m-bit width to be written into said memory cell array unit and the data input/output unit reading out data with the m-bit width from said memory cell array unit; and a data test circuit unit that converts the data with the m-bit width read out from said memory cell array unit to a serial signal for data observation and outputs a serial signal resulting from the conversion.

7. A semiconductor memory device according to claim 6, wherein:

said data test circuit unit includes a shift register.

8. A semiconductor memory device according to claim 7, wherein:

said shift register is constituted of m flip-flops.

9. A semiconductor memory device according to claim 8, wherein:

said shift register is constituted of m sets of latch groups, and each of said latch groups comprises a first latch that latches input data in response to a signal indicating a logical high level and a second latch that latches the input data in response to a signal indicating a logical low level.

10. A semiconductor memory device comprising:

a memory cell array unit constituted of a plurality of memory cells in which data are stored;

a data input/output unit outputting data with an m-bit width to be written into said memory cell array unit and the data input/output unit reading out data with the m-bit width from said memory cell array unit; and a data test circuit unit converting a test data serial signal provided from the outside to a test data signal with the m-bit width and the data test circuit unit providing the test data signal to either said memory cell array unit or said data input/output unit.

11. A semiconductor memory device comprising:

a memory cell array unit constituted of a plurality of memory cells in which data are stored;

a data input/output unit outputting data with an m-bit width to be written into said memory cell array unit and the data input/output unit reading out data with the m-bit width from said memory cell array unit; and a data test circuit unit converting the data with the m-bit width read out from said memory cell array unit to a serial signal for data observation and outputting the serial signal resulting from the conversion, the data test circuit unit converting a test data serial signal provided from the outside to a test data signal with the m-bit width and the data test circuit unit providing the test data signal to either said memory cell array unit or said data input/output unit.

12. A semiconductor memory device comprising:

a memory cell array unit constituted of a plurality of memory cells in which data are stored;

an address signal generating unit that generates an address signal with an n-bit width to specify one or a plurality of memory cells among said plurality of memory cells;

a data input/output unit outputting data with an m-bit width to be written into said memory cell array unit and the data input/output unit reading out data with the m-bit width from said memory cell array unit;

an address signal test circuit unit converting the address signal with the n-bit width output from the address signal generating unit to a serial signal for address signal observation and outputting the serial signal resulting from the conversion, the address signal test circuit unit converting a test address serial signal provided from the outside to a test address signal with the n-bit width and the address signal test circuit unit taking in the address signal from the address signal generating unit and providing either the test address signal or the address signal to said memory cell array unit; and a data test circuit unit converting the data with the m-bit width read out from said memory cell array unit to a serial signal for data observation and outputting the serial signal resulting from the conversion, the data test circuit unit converting a test data serial signal provided from the outside to a test data signal with the m-bit width and the data test circuit unit providing the test data signal to either said memory cell array unit or said data input/output unit.

13. A semiconductor memory device according to claim 12, wherein:

the address signal test circuit unit provides said test address serial signal to said data test circuit unit as the test data serial signal.

14. A semiconductor memory device according to claim 13, wherein:

the address signal test circuit unit includes a shift register.

15. A semiconductor memory device according to claim 13, wherein:

said data test circuit unit includes a shift register.

16. A semiconductor memory device according to claim 12, wherein:

said data test circuit unit provides the test data serial signal to the address signal test circuit unit as said test address serial signal.

17. A semiconductor memory device according to claim 16, wherein:

the address signal test circuit unit includes a shift register.

18. A semiconductor memory device according to claim 16, wherein:

said data test circuit unit includes a shift register.

19. A semiconductor memory device according to claim 12, wherein:

the address signal test circuit unit includes a shift register.

20. A semiconductor memory device according to claim 12, wherein:

said data test circuit unit includes a shift register.

* * * * *